United States Patent [19]

Kanai et al.

[11] Patent Number: 4,678,942

[45] Date of Patent: Jul. 7, 1987

[54] EMITTER COUPLED LOGIC CIRCUIT WITH HIGH DRIVABILITY FOR CAPACITIVE LOAD

[75] Inventors: Yasunori Kanai, Inagi; Taichi Saitoh, Yokohama, both of Japan

[73] Assignee: Fujitsu Limited, Kanagawa, Japan

[21] Appl. No.: 779,356

[22] Filed: Sep. 23, 1985

[30] Foreign Application Priority Data

Sep. 25, 1984 [JP] Japan .............................. 59-198606

[51] Int. Cl.$^4$ .................... H03K 19/01; H03K 19/086
[52] U.S. Cl. .................................... 307/455; 307/270;
307/315; 307/318; 307/443
[58] Field of Search ................ 307/443, 455, 456, 246, 307/270, 315, 318

[56] References Cited

U.S. PATENT DOCUMENTS

| | | | |
|---|---|---|---|
| 3,978,347 | 8/1976 | Hollstein et al. .................. | 307/455 |
| 4,276,485 | 6/1981 | Rydval ............................. | 307/455 X |
| 4,287,435 | 9/1981 | Cavaliere et al. ............... | 307/455 X |
| 4,490,630 | 12/1984 | Freeman ........................... | 307/455 |
| 4,527,078 | 7/1985 | Smith ............................... | 307/456 X |
| 4,531,067 | 7/1985 | Banker et al. .................... | 307/443 X |
| 4,539,493 | 9/1985 | Varadarajan ...................... | 307/455 |
| 4,551,638 | 11/1985 | Varadarajan .................... | 307/443 X |

Primary Examiner—Stanley D. Miller
Assistant Examiner—D. R. Hudspeth
Attorney, Agent, or Firm—Armstrong, Nikaido, Marmelstein & Kubovcik

[57] ABSTRACT

An ECL (Emitter Coupled Logic) circuit is provided which has an increased ability to drive a large capacitive load or to drive a large fan-out circuit, wherein the power consumption per gate is reduced. The output circuit of the ECL circuit is provided with an emitter follower transistor which has the current therethrough detected by a detecting transistor. A current control transistor is provided to quickly charge the load capacitance under the control of the detecting transistor, and thus, the voltage drop of the output signal is improved. One of the emitter follower transistor and the current transistor are always cut off when the other is in a conductive state, and therefore, the current running through the circuit is reduced.

11 Claims, 12 Drawing Figures

BASE VOLTAGE OF $T_6$
COLLECTOR VOLTAGE OF $T_6$

BASE VOLTAGE OF $T_8$

COLLECTOR CURRENT OF $T_8$

EMITTER CURRENT OF $T_6$

TIME

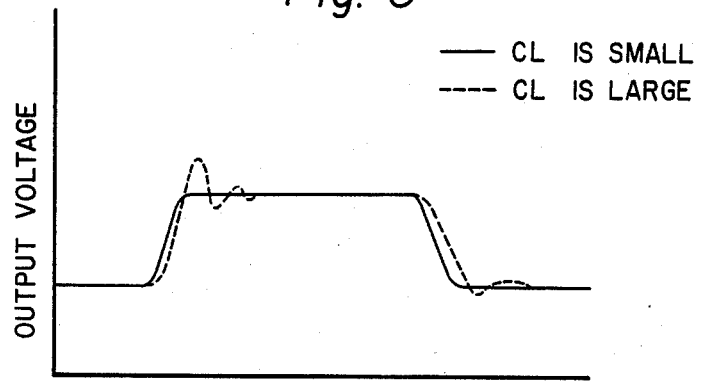
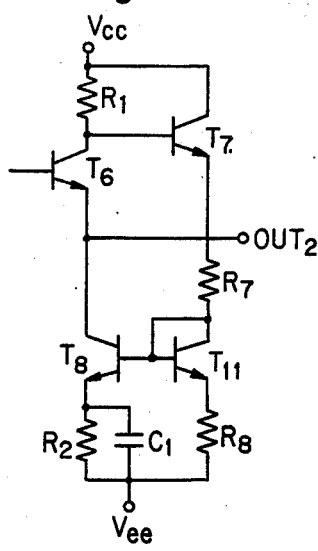
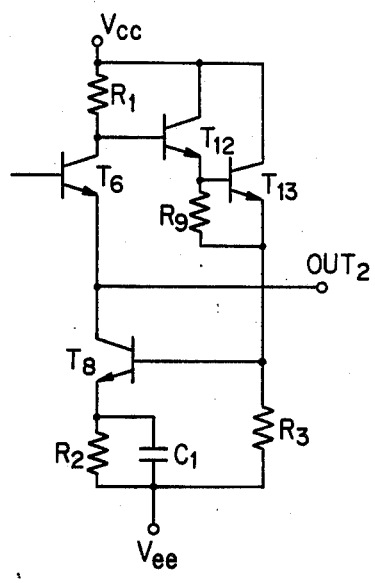

EMITTER COUPLED LOGIC CIRCUIT WITH HIGH DRIVABILITY FOR CAPACITIVE LOAD

BACKGROUND OF THE INVENTION

The present invention relates to an ECL (Emitter Coupled Logic) circuit, more specifically to an ECL circuit in which power consumption per gate is small but the propagation delay time does not become large when it is used for driving a large capacitive load or a large fan-out circuit.

It is known that in an ECL circuit, each of the transistors in the circuit operates in a non-saturation mode, so a small signal operation of the logic circuit is possible. This enables a quicker operation as compared to other logic circuits. Therefore, the ECL circuits are used very widely for logic circuits which require a high speed operation. These circuits are sometimes called CML (Current Mode Logic) circuits. However, as the integration of the elements in LSIs (large scale integrated circuits) increases, the power consumption of the circuit becomes large and it is very important to decrease the heat generation in the LSI chips. Thus, it is desirable to make the circuit operate with as small a current as possible.

When a circuit is made to operate with a small current, its ability to drive a large capacitive load or a large fan-out circuit is decreased. Moreover, the operation speed decreases or the propagation delay time of the signal increases because of the parasitic capacitance of the load or the fan-out circuits. This is another difficulty which must be overcome in the LSI circuit design.

Description of Prior Art

To clarify the advantage of the present invention over the prior art, a prior art ECL circuit will be described briefly with regard to an example of an OR and NOR circuit as shown in FIG. 10. The figure shows a fundamental configuration of an ECL circuit. As shown in the figure, the ECL circuit comprises at least a pair of transistors T1 and T3 with their emitters coupled to each other. Another transistor T2 is connected in parallel to the transistor T1 to provide a dual input IN1 and IN2 for each of the bases. The collectors of the pair of transistors are connected to a positive voltage source Vcc via respective collector resistors Rc. The emitters of the transistors are coupled to each other, and are connected to a constant current source which comprises a series connected transistor T4 and a resistor Re connected to a negative voltage source Vee. A control voltage Vcs is supplied to the base of the transistor T4 to provide a constant current through the transistor T4. The base of the transistor T3 is supplied with a reference voltage Vref which determines the threshold level of the transistors T1 and T2.

Two parallel emitter follower circuits comprising a series connection of a transistor T5 and a resistor Rp, and a transistor T6 and a resistor Rp respectively, are connected between Vcc and Vee. Each collector of the pair of transistors T1/T2 and T3 are respectively connected to the base of the transistors T5 and T6, and form an emitter follower output circuit to provide a low impedance output OUT1 and OUT2 from the respective emitters.

The operation of the circuit of FIG. 10 is as follows. If one or both of the dual inputs IN1 and IN2 is at a high voltage (H), one or both of the transistors T1 and T2 become conductive (ON), and the transistor T3 is cut off (OFF). Then the base voltage of the transistor T5 becomes low voltage (L), and the base voltage of the transistor T6 becomes H. Thus, the output of the OUT1 becomes L, and output of the OUT2 becomes H. However, if both of IN1 and IN2 are L, the transistors T1 and T2 are cut off, and the transistor T3 becomes ON. Thus, the transistor T5 is ON and the OUT1 becomes H, but the transistor T6 is OFF and the OUT2 becomes L. This means that the output terminal OUT1 provides a NOR and the OUT2 provides an OR output signal with regard to the input signals to the dual input terminals IN1 and IN2.

In the ECL circuit as shown in FIG. 10, each of the transistors operates in a non-saturated state, so a small signal operation of the logic is possible, and very high speed switching of the signal can be attained compared to other logic circuits. But when the load is a high capacitive load or the circuit is intended to drive a large fan-out circuit, the propagation delay time of the signal increases. This delay is especially large when the output signal varies from H to L compared to when the output signal varies from L to H, because of the emitter follower transistors T5 and T6.

FIG. 11 shows the variation of the delay time t of the signal as a function of the increase in the capacitive load CL. Both are in arbitrary scales. The curve t(PLH) indicates the variation of the signal propagation delay time when the output signal varies from a L to H level, that is a voltage buildup. The curve t(PHL) indicates the variation of the signal propagation delay time when the output signal varies from an H to L level, that is a drop in the voltage.

These curves correspond respectively to the left and right hand sides of the pulse shown in FIG. 12. In FIG. 12, the solid line curve indicates the waveform when the capacitive load CL is small, and the dashed line indicates the waveform when CL is large. As can be seen in the figures, the influence of the capacitive load is larger in the voltage drop (right hand side) than in the voltage buildup (left hand side).

The reason for this is considered as follows. In FIG. 10, the capacitive load is represented as CL shown by a broken line at the OUT2 side. The phenomena will be described with regard to the OUT2 side of the circuit, but it is the same for the OUT1 side. When the transistor T6 is cut off, the capacitive load CL (that is a stray capacity) is charged to the voltage equal to the source voltage Vee. When the transistor T6 is ON, CL is discharged through the transistor T6. Since T6 is in a cathode follower operation and has a low impedance, the discharge occurs comparatively quickly and the dependence of the voltage buildup time to the capacitance is small. However, when the transistor T6 cuts off again, the capacity CL is charged through the resistor Rp. Therefore, the Rp should be small to reduce the time for charging. But if the resistance of Rp is made small, the current through the circuit increases. It is undesirable to increase the current because of heat generation in the IC. So the delay time of the voltage drop t(PHL) becomes larger compared to that of voltage buildup t(PLH).

In the above description the capacitive load CL has been loaded between the emitter of the transistor T6 and the source voltage Vcc (FIG. 10). But it will be clear to one skilled in the art that the stray capacitance may also appear between the OUT2 and the Vee or ground, and the above description can be extended easily to such cases.

As mentioned above, when the integration scale in ICs increases, the line length to interconnect the internal circuits increases, but the current of the circuit must be reduced to avoid the heat problem, and when the current is reduced, the delay time increases.

SUMMARY OF THE INVENTION

An object of the present invention, therefore, is to provide an ECL circuit whose power consumption is small and which has the ability to drive a large capacitive load or a large fan-out circuit without increasing the delay of the signal.

In order to attain the above object, the present invention provides a means to drive the load and pull down the voltage quickly when the emitter follower transistor of the ECL circuit (T6 for example) is cut off.

The means comprises a detector means which detects the current at the collector of the emitter follower transistor, and controls a current control transistor inserted between the emitter of the emitter follower transistor and Vee to quickly Pull down the voltage of the load line when the emitter follower transistor is cut off.

The means may be modified in various ways. Details of the invention and these modifications will become clear from a reading of the detailed description of the preferred embodiments of the invention with reference to the accompanied drawings.

BRIEF DESCRIPTION OF THE DRAWINGS

FIG. 3 shows waveforms of output signals simulated by a computer.

FIG. 4 is a circuit diagram of a second embodiment of the ECL circuit of the present invention.

FIG. 5 is a circuit diagram of a third embodiment of the ECL circuit of the present invention.

Throughout the drawings, the same or similar parts are designated by same or similar symbols or reference numerals.

DETAILED DESCRIPTION OF THE PREFERRED EMBODIMENTS

Figure 1:
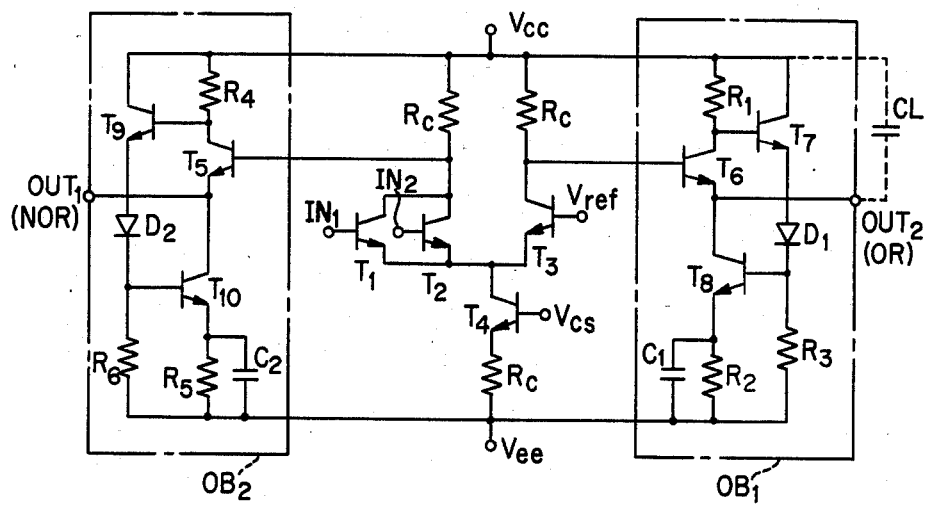
FIG. 1 is a circuit diagram of a first embodiment of the ECL circuit by the present invention.
Figure 10:
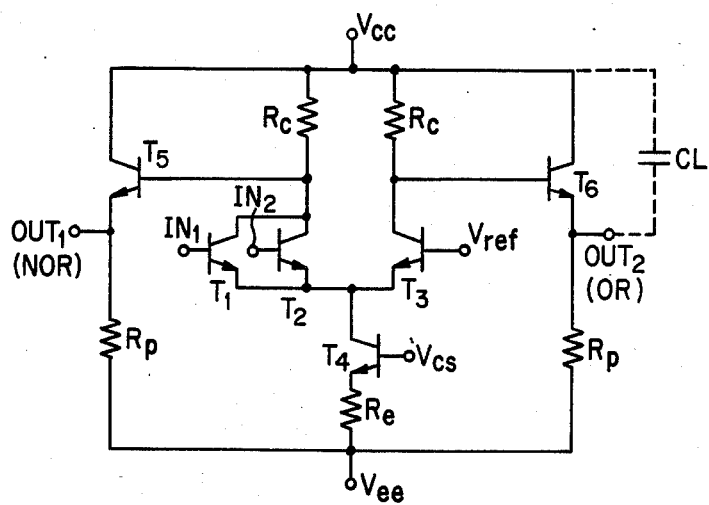
FIG. 10 is a circuit diagram of a typical prior art ECL circuit having an OR and NOR circuit.

FIG. 1 shows a circuit diagram of an embodiment of the present invention. The figure shows an ECL circuit corresponding to that of FIG. 10 which has a two input OR and NOR gate. In the following description, the disclosure will be given with respect to the OR and NOR gate such as shown in FIGS. 1 or 10. However, it will become clear that the application of the present invention is not limited to such a circuit, since there are various kinds of ECL circuits. The present invention is applicable to any of the kinds of ECL circuits.

Comparing the circuit of FIG. 1 with that of FIG. 10, each of the emitter follower circuits of FIG. 1 has been replaced by an output circuit which is indicated by OB1 and OB2 respectively surrounded by a chained line. The center portion of the circuit of FIG. 1 is same as that of FIG. 10, namely an ordinary two input OR and NOR circuit. The description of this portion of the circuit of FIG. 1 will thus be omitted for the sake of simplicity. The description below will be given with regard to the OR gate side, that is the right hand side, of the circuit, but it will be clear that the configuration and the operation of the output circuit is similar for the left hand side of the circuit.

The output circuit (OBs) is provided with a resistor R1 and a transistor T7 on the collector side of the emitter follower transistor T6. The resistor R1 is connected between the voltage supply source Vcc and the collector of the transistor T6, and provides a voltage corresponding to the current flowing through the transistor T6 to the base of the detecting transistor T7.

The series resistor Rp in FIG. 10 is replaced by a current control transistor T8 and a resistor R2, connected in series between the emitter of T6 and the negative side of voltage source Vee. The resistor R2 is by-passed by a capacitor C1. The base of the transistor T8 is connected to Vee through a resistor R3, and the base of the current control transistor T8 is supplied with the output voltage of the detecting transistor T7 through a level shift diode D1.

Operation of the circuit is as follows. As mentioned before with regard to FIG. 10, when the base of the transistor T6 becomes low level (L), because of the load capacitance CL, the voltage level at the emitter of the transistor T6, which is the output OUT2, can not respond quickly. Therefore, the transistor T6 becomes cut off so that the collector of T6 becomes high because there is no voltage drop across the resistor R1. Then the base voltage of the detecting transistor T7 rises so that it becomes conductive (ON). The emitter of T7 thus becomes high and this voltage is supplied to the base of the current control transistor T8 through the level shift diode D1. The transistor T8 thus becomes conductive and the load capacitance CL is charged through the path of CL-T8-R2-Vee. Since the resistor R2 is by-passed by the capacitor C1, the impedance of the above charging path is low. Therefore, the fall time of the output voltage of OUT2 is as quick as its rise time.

When the base of the emitter follower transistor T6 is brought to high level (H), the load capacitance CL is discharged quickly through the low impedance emitter follower transistor T6, and the OUT2 quickly becomes H. Furthermore, since the base of the transistor T7 becomes L level, the base of the transistor T8 also becomes L, so that the transistor T8 changes to the OFF state. Therefore, the build up time of the OUT2 is faster than the prior art circuit.

Figure 2:
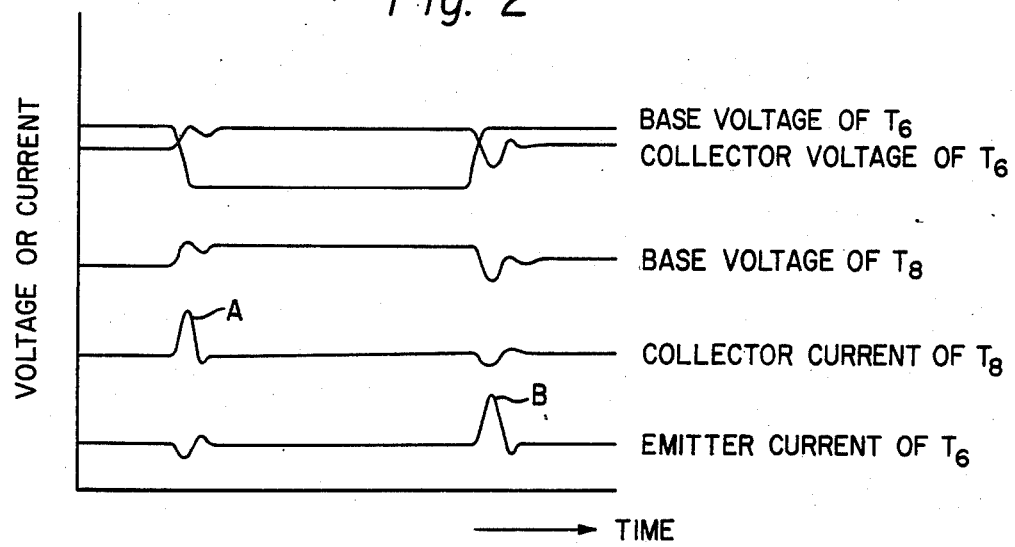
FIG. 2 shows waveforms of signals at various portions of the circuit of FIG. 1.

The above operation will become more apparent from an inspection of FIG. 2, which depicts the waveforms of signal at various points in the circuit of FIG. 1. The curves were obtained by a computer aided simulation of the circuit operation. It is difficult to observe the waveform of the ECL circuit directly, for the measurement itself distorts the waveform. It should be pointed out that the collector current of T8 has a sharp pulse A. This corresponds to a rush of current for charging the load capacitor CL. The charging is completed by the pulse current and in the remaining portion of the time current does not flow in T8. This is due to the fact that the capacitance of C1 is selected larger than that of the load capacitance CL. Similarly the emitter current of the emitter follower transistor T6 is almost zero except for the peak current B, which corresponds to the current rush to discharge CL.

Compared to the circuit of FIG. 10, in which the charging current runs continuously through the resistor Rp, in the circuit of FIG. 1, one of the transistors T6 or T8 is cut off when the other is in the conductive state. Thus the voltage source Vcc-Vee only has to supply the rush current A and B in FIG. 2, and therefore, the charging current is decreased to a greater extend. Moreover, the emitter follower transistor T6 only has current flow to charge up the load capacitance CL and it does not need to provide current flow through the resistor Rp (FIG. 10). This decreases the load of the transistor T6 and further increases the speed to raise the output voltage of OUT2.

Figure 12:
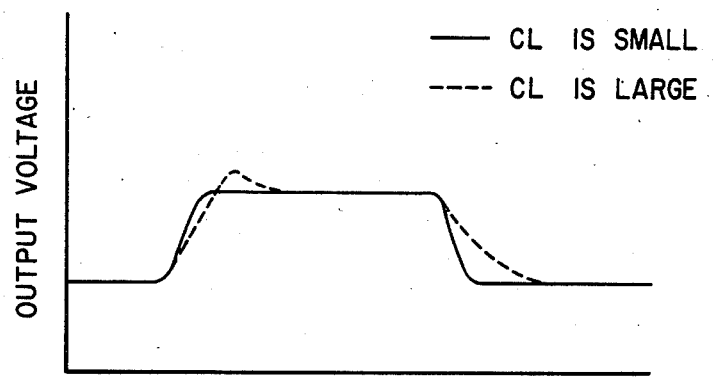
FIG. 12 is a graph illustrating the delay of the signal at the voltage buildup and voltage drop portions of the signal.

FIG. 3 shows a computer simulated waveform of the output signal. In the figure, the solid line shows the output waveform when the load capacitance is small (small fan-out), simulating a case when the capacitance is 0.1 pF and the wiring length is 0.5 mm. The dashed line shows the output waveform when the load capacitance is large (large fan-out), simulating a case when the capacitance is 0.6 pF and the wiring length is 3 mm. Comparing these curves with those of FIG. 12, whose condition for the simulation is same, it will be noticed that the waveform for the small load capacitance or for the small fan-out (solid line curve) is almost same, but for the large capacitance or large fan-out (dashed line curve) the drop of the pulse is improved to a greater extent, and the rise of the pulse is also improved. This indicates that the circuit by the present invention has improved the driving ability of the ECL circuit for large capacitance or large fan-out circuits.

FIG. 4 shows an output circuit diagram of the ECL circuit of a second embodiment of the present invention, which is a modification of the circuit of FIG. 1. In this embodiment, the emitter signal of the detecting transistor T7 is fed to the base of the current control transistor T8 by a circuit composed of a series connection of a resistor R7, a transistor T11 and a resistor R8. In this case, the transistors T8 and T11 form a current mirror circuit. Therefore, when the base of the transistor T6 becomes L so that the transistor T6 is cut off and the current through the transistor T7 increases, the current through the transistor T8 also increases and the capacitive load (not shown) is charged quickly. Thus, the fall of the output OUT2 is improved. When the base of the transistor T6 becomes H so that the transistor T6 becomes conductive again and the current through the transistor T7 decreases, the current through the transistor T8 decreases. This decreases the load of the emitter follower transistor T6. Thus, the rise of the signal is also improved.

FIG. 5 shows an output circuit diagram of a third embodiment of the present invention. In this embodiment, the detecting transistor T7 in FIG. 1 has been replaced by a Darlington pair of transistors T12 and T13, and the level shift diode D1 has been omitted. A resistor R9 is inserted between the emitter of T12 and the resistor R3 to maintain the transistor T12 operative.

In this circuit, the collector load of the emitter follower transistor T6 is further decreased, so the response to the buildup of the output signal is further increased as compared to the above mentioned embodiments. This was certified by computer aided simulation of the circuit operation.

Figure 6:
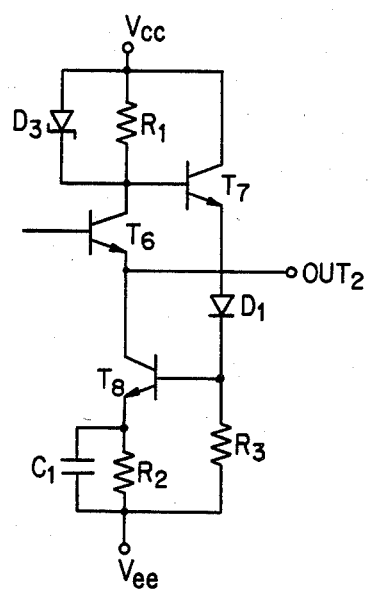
FIG. 6 is a circuit diagram of a fourth embodiment of the ECL circuit of the present invention.

FIG. 6 is a circuit diagram for an output circuit of a fourth embodiment of the present invention. In this embodiment, a Shottky clamp diode D3 is inserted in parallel with the resistor R1 of FIG. 1, to avoid the saturation of the emitter follower transistor T6. This improves the high speed operation of the transistor T6.

Figure 7:
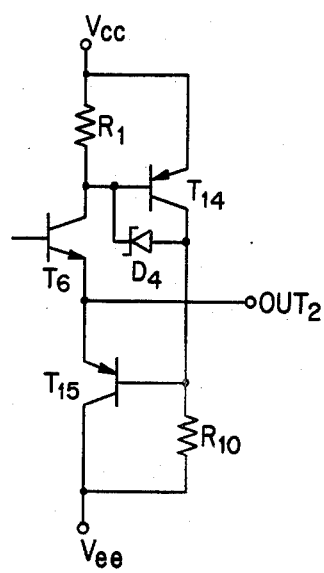
FIG. 7 is a circuit diagram of a fifth embodiment of the ECL circuit of the present invention.

FIG. 7 shows a fifth embodiment of the output circuit for an ECL circuit of the present invention. This circuit comprises a pnp type detecting transistor T14 whose base is connected to the collector of the emitter follower transistor T6. The emitter and collector of the transistor T14 are respectively connected to the positive side of the voltage source Vcc, and to the base of a pnp type control transistor T15. A Shottky clamp diode D4 is connected between the base and collector of T14 to avoid the saturation of the transistor T14. The current control transistor T15 which is a pnp type transistor is connected between the emitter of the emitter follower transistor T6 and the negative side of the voltage source Vee. The emitter and collector of the current control transistor T15 are connected to the emitter of T6 and Vee respectively. A resistor R10 is connected between the base of the current control transistor T15 and Vee to maintain the detecting transistor T14 operative. The output OUT2 is taken from the emitter of T6.

Operation of the circuit of FIG. 7 is as follows. When the base voltage of the emitter follower transistor T6 is switched from H to L, the base of T14 shifts from L to H and T14 is cut off. The base voltage of the current control transistor T15 is therefore pulled down by the resistor R10, and it becomes conductive, and thus the load capacitor (CL not shown) is charged quickly through the transistor T15 and the output voltage is pulled down quickly. When the base voltage of the transistor T6 is switched from L to H, the transistor T14 turns ON, and the base voltage of T15 becomes high, and it is cut off. The load of the emitter follower transistor T6 is thus reduced (compared to the circuit of FIG. 10), and the voltage build up of the output signal becomes sharper.

Figure 8:
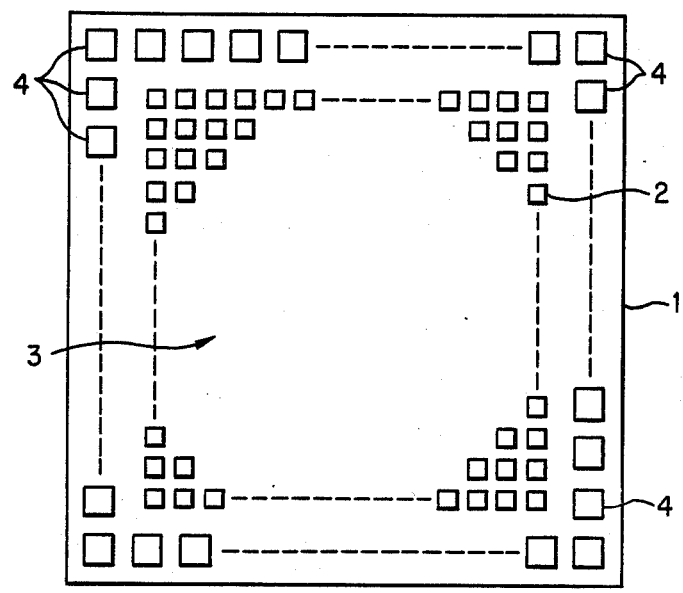
FIG. 8 is a plan view of a typical LSI chip showing an ordinary layout of the devices on the chip.

FIG. 8 shows a typical lay out of circuit elements in ordinary gate array LSI chip. On the chip 1, a cell array 3 comprises unit cells 2 arranged in a matrix, and input-/output (I/0) buffer circuits 4 which are arranged on the periphery of the chip 1. The circuit of the present invention described above are preferable used as the unit cells 2. By doing so, the total heat generation in the chip is reduced, and the switching speed is increased.

However, as can be seen in the circuit configurations of the present invention described above, the circuits of the present invention need more elements than the prior art. Though the switching speed and fan-out number are increased and the total power consumption is decreased, the increase of the circuit elements may be a disadvantage of the present invention. The increase in the number of elements in each of the unit cells means an increase of the chip area. The chip area should be as small as possible to increase the number of chips on each of the semiconductor slices (wafers), because the number of chips per wafer relates to the number of chips available from one production sequence, and this is a large factor in cost reduction of the ICs.

Figure 9:
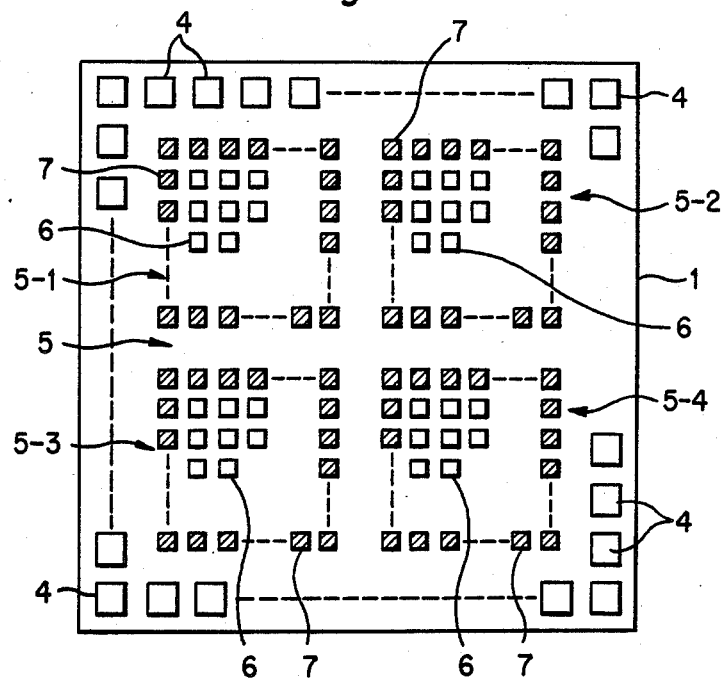
FIG. 9 is a plan view of another type of LSI chip showing an arrangement of the devices on the chip.
Figure 11:
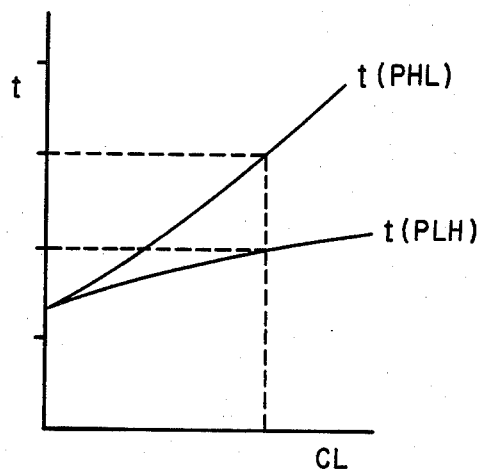
FIG. 11 is a graph depicting the variation of the delay time of a signal in the ECL circuit with the variation of capacitive load.

To overcome the above difficulty, following lay out of devices on a chip is proposed by the inventors. FIG. 9 shows the lay out of the devices on a gate array LSI chip. This type of arrangement provides I/0 buffer cells 4 arranged on the periphery of the chip 1 and a unit cell array 5 arranged inside of the buffer cells 4. The unit cell array 5 is divided into several numbers of cell array blocks. In FIG. 9 for example, the cell array 5 is divided into four blocks, 5-1, 5-2, 5-3, and 5-4, and each of the cell array blocks is provided with unit cells of a first type 6 arranged in a matrix, and around them are provided unit cells of a second type 7 as shown in FIG. 9. The unit cells of the first type 6 are like the circuit of FIG. 10 for example, which has rather poor driving capacity but smaller size. The unit cells of the second type 7 are the circuits as shown in FIG. 1, for example, which have a larger driving capacity.

The lay out of FIG. 9 has the following advantages. For the interconnections between the unit cells, that is, the wiring in the cell array block, a long wiring is unnecessary. The unit cells of the first type can thus realize its full ability, and small size. The connecting wirings between the cell array blocks or wirings between the cell array and the I/0 buffer cells 4, becomes long, and therefore, the unit cells of the second type namely the circuit of the present invention is most applicable.

As has been described above, by the use of the present invention, it is possible to provide an ECL circuit for which power consumption is small but which has a large driving capacity for a large capacitive load or a large fan-out circuit. The disclosure has been given with respect to an OR and NOR circuit. It is clear however, that the circuit of the present invention can be applied to any kind of ECL circuit. Further, it will be clear and simple for one skilled in the art that the transistors used in the circuit may be altered from a pnp type to an npn type or vice versa with a small modification of the circuit elements and polarity of the applied voltage.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

We claim:

1. An emitter coupled logic (ECL) circuit comprising:
   at least a pair of transistors having the emitters thereof coupled together;
   an emitter follower transistor for providing an output, said emitter follower transistor having a base connected to the collector of one of said pair of transistors;
   an output terminal connected to the emitter of the emitter follower transistor;
   a current control transistor connected to the emitter follower transistor; and
   a control circuit means coupled to the collector of said emitter follower transistor for detecting the collector current of said emitter follower transistor, and
   said control circuit means being connected to the base of said current control transistor for controlling the current through said current control transistor in accordance with the collector current of the emitter follower transistor, so that said current control transistor pulls down the output voltage when the collector current becomes small.

2. An ECL circuit according to claim 1, wherein said control circuit means comprises:
   a resistor connected between the collector of said emitter follower transistor and the positive side of a first voltage source; and
   a detecting means connected to the collector of said emitter follower transistor, wherein output of said detecting means is connected to said current control transistor.

3. An ECL circuit according to claim 2, wherein said detecting means is a pair of transistors connected as a Darlington pair.

4. An ECL circuit according to claim 2, including a resistor and a capacitor connected in parallel wherein the emitter of said current control transistor is connected to the negative side of a second voltage source through said parallel resistor and capacitor.

5. An ECL circuit according to claim 2, wherein said detecting means comprises a detecting transistor and a diode connected between the emitter of said detecting transistor and the base of said current control transistor.

6. An ECL circuit according to claim 2, wherein said control circuit means further comprises:
   a clamp diode connected between the collector of said emitter follower transistor and the positive side of said first voltage source; and
   wherein said detecting means comprises a detecting transistor and a level shift diode connected between said detecting transistor and the base of said current control transistor.

7. An ECL circuit according to claim 2, wherein said detecting means comprises a detecting transistor and a clamp diode connected between the base and the collector of said detecting transistor.

8. An ECL circuit according to claim 2, further comprising a resistor connected between the base of said current control transistor and the negative side of a second voltage source.

9. An ECL circuit according to claim 2, further comprising a series connected circuit comprising:
   a first resistor having one terminal connected to said detecting means;
   a transistor having the base thereof connected to the base of said current control transistor and the collector thereof connected to the other terminal of said first resistor and the base of said transistor; and
   a second resistor connected between the emitter of said transistor and the negative side of a second voltage source.

10. An ECL circuit according to claim 2, wherein all of said transistors are npn type transistors.

11. An ECL circuit according to claim 2, wherein said detecting means includes a detecting transistor and wherein said detecting transistor and said current control transistor are pnp type transistors.

* * * * *